(12) United States Patent
Kim

(10) Patent No.: US 10,579,472 B2
(45) Date of Patent: Mar. 3, 2020

(54) SEMICONDUCTOR DEVICES

(71) Applicant: SK hynix Inc., Icheon-si, Gyeonggi-do (KR)

(72) Inventor: Chang Hyun Kim, Seoul (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 160 days.

(21) Appl. No.: 15/604,138

(22) Filed: May 24, 2017

(65) Prior Publication Data

US 2018/0060165 A1   Mar. 1, 2018

(30) Foreign Application Priority Data

Aug. 23, 2016   (KR) .................. 10-2016-0106756

(51) Int. Cl.
*G06F 11/10* (2006.01)
*G11C 29/52* (2006.01)
*G11C 29/04* (2006.01)

(52) U.S. Cl.
CPC ...... *G06F 11/1068* (2013.01); *G06F 11/1048* (2013.01); *G11C 29/52* (2013.01); *G11C 2029/0411* (2013.01)

(58) Field of Classification Search
CPC ........ G06F 11/1068; G11C 2029/0411; G11C 29/52
See application file for complete search history.

(56) References Cited

U.S. PATENT DOCUMENTS

| | | | | |
|---|---|---|---|---|
| 6,957,378 | B2 * | 10/2005 | Koga | ................. G06F 11/1032 714/763 |
| 8,327,243 | B1 * | 12/2012 | Norrie | ............... H03M 13/1525 714/758 |
| 2005/0149833 | A1 * | 7/2005 | Worley | ................. H03M 13/19 714/781 |
| 2011/0154160 | A1 | 6/2011 | Yurzola et al. | |
| 2012/0188830 | A1 * | 7/2012 | Jeong | ....................... G11C 7/20 365/189.07 |

FOREIGN PATENT DOCUMENTS

KR   20110073932 A   6/2011

* cited by examiner

*Primary Examiner* — Guy J Lamarre
(74) *Attorney, Agent, or Firm* — William Park & Associates Ltd.

(57) ABSTRACT

A semiconductor device may include an error correction circuit and a fuse signal generation circuit. The error correction circuit may be configured to generate a syndrome signal from data using an error correction code. The fuse signal generation circuit may be configured to receive the syndrome signal to generate a fuse signal for repairing a cell array storing the data.

14 Claims, 13 Drawing Sheets

FIG.5

|    | 21a |    |    |    | 22a |    |    |    |
|----|----|----|----|----|----|----|----|----|
| R1 | 1  | 0  | 1  | 1  | 1  | 0  | 1  | 0  |
| R2 | 1  | 1  | 0  | 1  | 0  | 1  | 0  | 1  |
| R3 | 1  | 1  | 1  | 0  | 1  | 1  | 0  | 0  |
| R4 | 0  | 1  | 1  | 1  | 0  | 0  | 1  | 1  |
|    | C1 | C2 | C3 | C4 | C5 | C6 | C7 | C8 |

FIG.7

| S<1:4> | REPAIR AREA |
|---|---|
| all zero | NO REPAIR |
| odd weight | 1st CELL ARRAY |
| even weight | 2nd CELL ARRAY |

FIG.9

| | R1 | R2 | R3 | R4 | R5 | |
|---|---|---|---|---|---|---|
| | 1 | 0 | 0 | 1 | 1 | C12 |
| 43 | 0 | 1 | 1 | 0 | 1 | C11 |
| | 1 | 0 | 1 | 0 | 1 | C10 |
| | 1 | 1 | 0 | 1 | 0 | C9 |
| | 1 | 0 | 1 | 1 | 0 | C8 |
| 42 | 0 | 1 | 1 | 1 | 0 | C7 |
| | 1 | 1 | 1 | 0 | 0 | C6 |
| 411 | 0 | 0 | 0 | 0 | 1 | C5 |
| | 0 | 0 | 0 | 1 | 0 | C4 |
| 41 | 0 | 0 | 1 | 0 | 0 | C3 |
| | 0 | 1 | 0 | 0 | 0 | C2 |
| | 1 | 0 | 0 | 0 | 0 | C1 |
| | R1 | R2 | R3 | R4 | R5 | |

FIG.10

| S<1:5> | REPAIR AREA |
|---|---|
| all zero | NO REPAIR |
| single odd S<5>="0" | PARITY CELL ARRAY |
| single odd S<5>="1" | CONVERSION CELL ARRAY |
| odd weight S<5>="0" | 1st CELL ARRAY |
| odd weight S<5>="1" | 2nd CELL ARRAY |
| even weight | 1st & 2nd CELL ARRAY |

SEMICONDUCTOR DEVICES

CROSS-REFERENCE TO RELATED APPLICATIONS

The present application claims priority under 35 U.S.C 119(a) to Korean Application No. 10-2016-0106756, filed on Aug. 23, 2016, which is incorporated herein by reference in its entirety.

BACKGROUND

1. Technical Field

Embodiments of the present disclosure may generally relate to semiconductor devices, and more particularly, relating to performing repair operations with an error correction code.

2. Related Art

Recently, a DDR2 scheme or a DDR3 scheme receiving and outputting four bit data or eight bit data during each clock cycle time has been used to improve the operation speeds of semiconductor devices. If data transmission speeds of the semiconductor devices become faster, the probability of occurring errors may increase while the data is transmitted in the semiconductor devices. Accordingly, novel design schemes have been proposed to improve the reliability of the data transmissions.

Whenever data is transmitted in semiconductor devices, error codes which are capable of detecting the occurrence of errors may be generated and transmitted with the data to improve the reliability of data transmissions. The error codes may include an error detection code (EDC) which is capable of detecting errors and an error correction code (ECC) which is capable of correcting the errors by itself.

SUMMARY

According to an embodiment, a semiconductor device may be provided. The semiconductor device may include an error correction circuit and a fuse signal generation circuit. The error correction circuit may be configured to generate a syndrome signal from data using an error correction code. The fuse signal generation circuit may be configured to receive the syndrome signal to generate a fuse signal for repairing a cell array storing the data.

According to an embodiment, a semiconductor device may include a syndrome generation circuit and a repair control circuit. The syndrome generation circuit generates a syndrome signal from first data, second data, a parity bit and a parity signal using an error correction code. The repair control circuit may be configured to generate a first repair control signal for repairing a first cell array storing the first data from the syndrome signal, a second repair control signal for repairing a second cell array storing the second data from the syndrome signal, a third repair control signal for repairing a conversion cell array storing the parity bit from the syndrome signal, and a fourth repair control signal for repairing a third cell array storing the parity signal from the syndrome signal.

According to an embodiment, a semiconductor device may include a first semiconductor device and a second semiconductor device. The first semiconductor device generates a first syndrome signal from first data, second data and a first parity signal using an error correction code realized by an error check matrix. The first semiconductor device may be configured to receive the first syndrome signal to generate a first repair signal for repairing a first cell array storing the first data and a second repair signal for repairing a second cell array storing the second data. The first semiconductor device may be configured to transmit the first and second repair signals to a first input/output line and a second input/output line. The second semiconductor device may be configured to generate a second syndrome signal from third data, fourth data and a second parity signal using the error correction code. The second semiconductor device may be configured to receive the second syndrome signal to generate a third repair signal for repairing a third cell array storing the third data and a fourth repair signal for repairing a fourth cell array storing the fourth data. The second semiconductor device may be configured to transmit the third and fourth repair signals to a third input/output line and a fourth input/output line.

BRIEF DESCRIPTION OF THE DRAWINGS

FIGS. 4 and 5 illustrate examples of some error check matrices for realizing error check codes in the semiconductor device of FIG. 1.

FIG. 7 is a table illustrating a repair operation performed in the semiconductor device illustrated in FIGS. 1 to 6.

FIG. 9 illustrates a representation of an example of an error check matrix for realizing error check codes in the semiconductor device of FIG. 8.

FIG. 10 is a table illustrating a repair operation performed in the semiconductor device illustrated in FIGS. 8 and 9.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
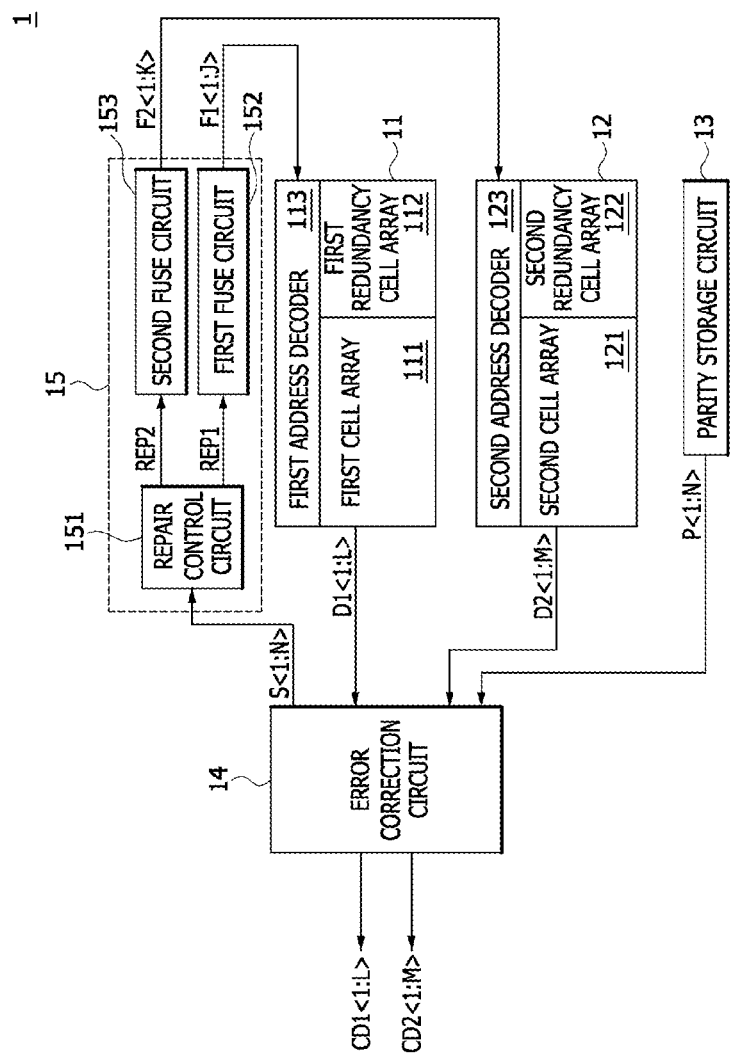
FIG. 1 is a block diagram illustrating a representation of an example of a configuration of a semiconductor device according to an embodiment.

Referring to FIG. 1, a semiconductor device 1 according to an embodiment may include a first data storage circuit 11, a second data storage circuit 12, a parity storage circuit 13, an error correction circuit 14 and a fuse signal generation circuit 15.

The first data storage circuit 11 may include a first cell array 111, a first redundancy cell array 112 and a first address decoder 113. The first cell array 111 may store first data D1<1:L> therein during a write operation. The first data D1<1:L> stored in the first cell array 111 may be outputted from the first cell array 111 during a read operation. The first address decoder 113 may decode an address to store the first data D1<1:L> in the first cell array 111 or to output the first data D1<1:L> from the first cell array 111. The first address decoder 113 may be configured to store the first data D1<1:L> in the first redundancy cell array 112 in response to a first fuse signal F1<1:J> during the write operation if the first cell array 111 has an erroneous cell. The first address decoder 113 may be configured to output the first data D1<1:L> from the first redundancy cell array 112 in response to the first fuse signal F1<1:J> during the read operation if the first cell array 111 has an erroneous cell. The number of bits included in the first data D1<1:L> may be set to be different according to the embodiments.

The second data storage circuit 12 may include a second cell array 121, a second redundancy cell array 122 and a second address decoder 123. The second cell array 121 may store second data D2<1:M> therein during the write operation. The second data D2<1:M> stored in the second cell array 121 may be outputted from the second cell array 121 during the read operation. The second address decoder 123 may decode an address to store the second data D2<1:M> in the second cell array 121 or to output the second data D2<1:M> from the second cell array 121. The second address decoder 123 may be configured to store the second data D2<1:M> in the second redundancy cell array 122 in response to a second fuse signal F2<1:K> during the write operation if the second cell array 121 has an erroneous cell. The second address decoder 123 may be configured to output the second data D2<1:M> from the second redundancy cell array 122 in response to the second fuse signal F2<1:K> during the read operation if the second cell array 121 has an erroneous cell. The number of bits included in the second data D2<1:M> may be set to be different according to the embodiments.

The parity storage circuit 13 may store a parity signal P<1:N> therein during the write operation and may output the parity signal P<1:N> stored therein during the read operation. The parity signal P<1:N> may be generated from the first and second data D1<1:L> and D2<1:M> by an error correction code (ECC) scheme using a Hamming code. The parity signal P<1:N> may be generated to correct errors included in the first and second data D1<1:L> and D2<1:M>. The Hamming code may be realized by an error check matrix for correcting errors of data. An example of the error check matrix will be described with reference to FIGS. 5 and 6 later.

The error correction circuit 14 may generate a syndrome signal S<1:N> in response to the first and second data D1<1:L> and D2<1:M> and the parity signal P<1:N>. The error correction circuit 14 may correct the errors included in the first and second data D1<1:L> and D2<1:M> to generate first corrected data CD1<1:L> and second corrected data CD2<1:M> according to the syndrome signal S<1:N>. A configuration and an operation of the error correction circuit 14 will be described with reference to FIG. 2 later.

The fuse signal generation circuit 15 may include a repair control circuit 151, a first fuse circuit 152 and a second fuse circuit 153. The repair control circuit 151 may generate a first repair signal REP1 and a second repair signal REP2 in response to the syndrome signal S<1:N>. The repair control circuit 151 may generate the first repair signal REP1 which is enabled to repair the first cell array 111 according to a logic level combination of the syndrome signal S<1:N> if the first cell array 111 storing the first data D1<1:L> has an erroneous cell. The repair control circuit 151 may generate the second repair signal REP2 which is enabled to repair the second cell array 121 according to a logic level combination of the syndrome signal S<1:N> if the second cell array 121 storing the second data D2<1:M> has an erroneous cell. The first fuse circuit 152 may generate the first fuse signal F1<1:J> in response to the first repair signal REP1. The first fuse circuit 152 may generate the first fuse signal F1<1:J> which is set to have a logic level combination for performing a repair operation for replacing the first cell array 111 having an erroneous cell with the first redundancy cell array 112 if the first repair signal REP1 is enabled. The logic level combination of the first fuse signal F1<1:J> for the repair operation may be set to be different according to the embodiments. The second fuse circuit 153 may generate the second fuse signal F2<1:K> in response to the second repair signal REP2. The second fuse circuit 153 may generate the second fuse signal F2<1:K> which is set to have a logic level combination for performing a repair operation for replacing the second cell array 121 having an erroneous cell with the second redundancy cell array 122 if the second repair signal REP2 is enabled. The logic level combination of the second fuse signal F2<1:K> for the repair operation may be set to be different according to the embodiments. A configuration and an operation of the repair control circuit 151 will be described with reference to FIG. 3 later.

Figure 2:
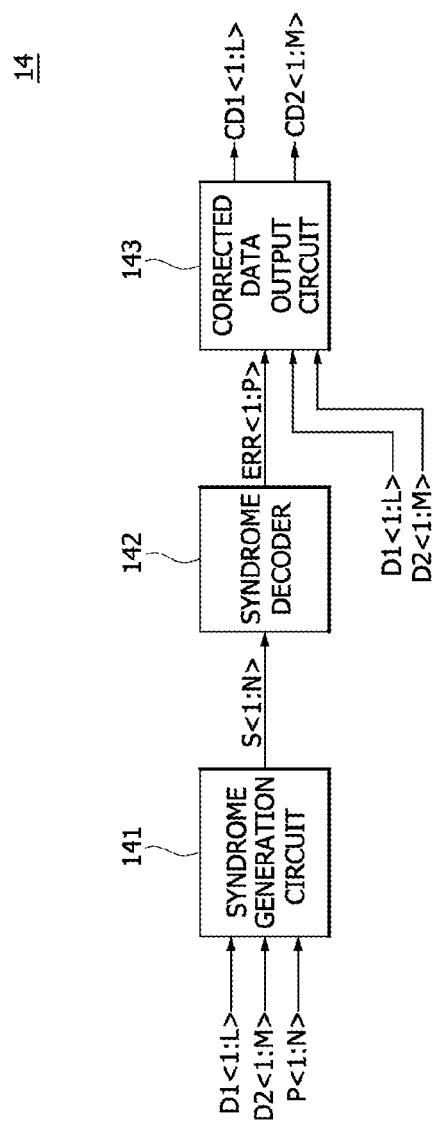
FIG. 2 is a block diagram illustrating a representation of an example of a configuration of an example of an error correction circuit included in the semiconductor device of FIG. 1.

Referring to FIG. 2, the error correction circuit 14 may include a syndrome generation circuit 141, a syndrome decoder 142 and a corrected data output circuit 143.

The syndrome generation circuit 141 may receive the first and second data D1<1:L> and D2<1:M> and the parity signal P<1:N> to generate the syndrome signal S<1:N> including information on errors of the first and second data D1<1:L> and D2<1:M>. The syndrome signal S<1:N> may be generated by an error correction code (ECC) scheme using a Hamming code. The Hamming code may be realized by an error check matrix for correcting errors of data. The error check matrix may be realized to include sub-matrices having column vectors, and each of the column vectors may have an odd weight or an even weight.

The syndrome decoder 142 may decode the syndrome signal S<1:N> to generate an error information signal ERR<1:P> including information on erroneous bits of the first and second data D1<1:L> and D2<1:M>. Logic level combinations of the error information signal ERR<1:P> may be set to correspond to the bits included in the first and second data D1<1:L> and D2<1:M>, respectively.

The corrected data output circuit 143 may correct the errors included in the first and second data D1<1:L> and D2<1:M> to generate the first corrected data CD1<1:L> and second corrected data CD2<1:M>, in response to the error information signal ERR<1:P>. The corrected data output circuit 143 may correct the error of the first data D1<1:L> to generate the first corrected data CD1<1:L> in response to the error information signal ERR<1:P>, if the first data D1<1:L> have an erroneous bit. The corrected data output circuit 143 may correct the error of the second data D2<1:M> to generate the second corrected data CD2<1:M> in response to the error information signal ERR<1:P>, if the second data D2<1:M> have an erroneous bit.

Figure 3:
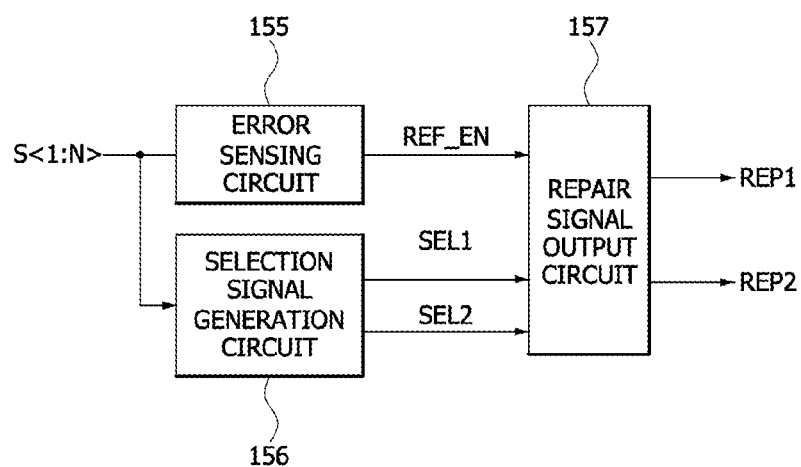
FIG. 3 is a block diagram illustrating a representation of an example of a configuration of an example of a repair control circuit included in the semiconductor device of FIG. 1.

Referring to FIG. 3, the repair control circuit 151 may include an error sensing circuit 155, a selection signal generation circuit 156 and a repair signal output circuit 157.

The error sensing circuit 155 may generate a repair control signal REF_EN which is enabled for a repair operation, in response to the syndrome signal S<1:N>. The error sensing circuit 155 may sense a logic level combination of the syndrome signal S<1:N> to generate the repair control signal REF_EN which is enabled if the first data D1<1:L> or the second data D2<1:M> has an error. The logic level combination of the syndrome signal S<1:N> when the first data D1<1:L> or the second data D2<1:M> has an error may be set to be different according to the embodiments. A logic level of the repair control signal REF_EN which is enabled may be set to be different according to the embodiments.

The selection signal generation circuit 156 may generate a first selection signal SEL1 and a second selection signal SEL2, one of which is selectively enabled in response to the syndrome signal S<1:N>. The selection signal generation circuit 156 may sense a logic level combination of the syndrome signal S<1:N> to generate the first selection signal SEL1 which is enabled and the second selection signal SEL2 which is disabled, if the first data D1<1:L> has an error. The selection signal generation circuit 156 may sense a logic level combination of the syndrome signal S<1:N> to generate the first selection signal SEL1 which is disabled and the second selection signal SEL2 which is enabled, if the second data D2<1:M> has an error. Logic levels of the first and second selection signals SEL1 and SEL2 which are enabled may be set to be different according to the embodiments.

The repair signal output circuit 157 may generate the first and second repair signals REP1 and REP2 in response to the repair control signal REF_EN and the first and second selection signals SEL1 and SEL2. If the first data D1<1:L> has an error, the first selection signal SEL1 may be enabled. Thus, if the first selection signal SEL1 and the repair control signal REF_EN are enabled, the repair signal output circuit 157 may generate the first repair signal REP1 which is enabled. If the second data D2<1:M> has an error, the second selection signal SEL2 may be enabled. Thus, if the second selection signal SEL2 and the repair control signal REF_EN are enabled, the repair signal output circuit 157 may generate the second repair signal REP2 which is enabled. If no error exits in the first and second data D1<1:L> and D2<1:M>, the repair control signal REF_EN may be disabled. Thus, if the repair control signal REF_EN is disabled, the repair signal output circuit 157 may generate the first and second repair signals REP1 and REP2 which are all disabled.

Figure 4:
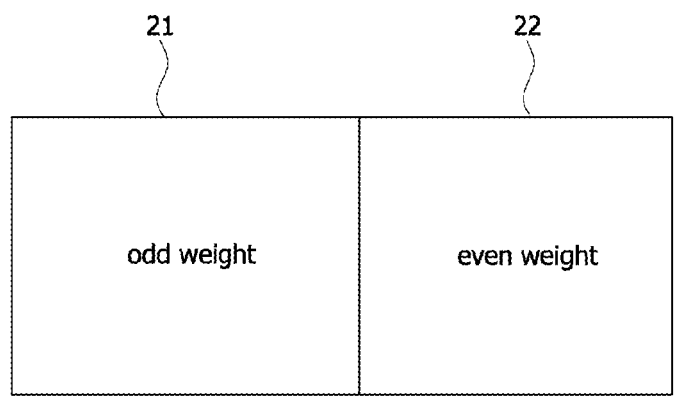

Referring to FIG. 4, the error check matrix used in an embodiment may include a first sub-matrix 21 and a second sub-matrix 22.

The first sub-matrix 21 may be realized to include column vectors having an odd weight. Each of the column vectors of the first sub-matrix 21 may be realized to have the same number of bits as each of the parity signal P<1:N> and the syndrome signal S<1:N>. That is, the number of bits included in each of the column vectors of the first sub-matrix 21 may be set to be equal to the number "N" of bits included in each of the parity signal P<1:N> and the syndrome signal S<1:N>. A description that the column vectors of the first sub-matrix 21 are realized to have an odd weight means that the number of bits having a value of "1" among the bits included in each of the column vectors of the first sub-matrix 21 is set to be an odd number which is equal to or greater than three. A bit having a value of "1" may correspond to a bit having a logic "high" level, and a bit having a value of "0" may correspond to a bit having a logic "low" level. A case that the number of bits having a value of "1" among bits included in a column vector is one may correspond to a case that the parity signal P<1:N> has an error. Thus, the column vector in which the number of bits having a value of "1" is one may be excluded from the column vectors of the first sub-matrix 21 of the error check matrix for checking errors of the data.

The second sub-matrix 22 may be realized to include column vectors having an even weight. Each of the column vectors of the second sub-matrix 22 may be realized to have the same number of bits as each of the parity signal P<1:N> and the syndrome signal S<1:N>. That is, the number of bits included in each of the column vectors of the second sub-matrix 22 may be set to be equal to the number "N" of bits included in each of the parity signal P<1:N> and the syndrome signal S<1:N>. A description that the column vectors of the second sub-matrix 22 are realized to have an even weight means that the number of bits having a value of "1" among the bits included in each of the column vectors of the second sub-matrix 22 is set to be an even number which is equal to or greater than two.

FIG. 5 illustrates an error check matrix corresponding to a case that the number of the parity bits is four in the error check matrix of FIG. 4.

Referring to FIG. 5, the error check matrix may include a first sub-matrix 21a and a second sub-matrix 22a. The first sub-matrix 21a may include column vectors having an odd weight. That is, a column vector of the first sub-matrix 21a, which is located in a first column line C1, may be set to have a column matrix form of $[1110]^T$, and a column vector of the first sub-matrix 21a, which is located in a second column line C2, may be set to have a column matrix form of $[0111]^T$. In addition, a column vector of the first sub-matrix 21a, which is located in a third column line C3, may be set to have a column matrix form of $[1011]^T$, and a column vector of the first sub-matrix 21a, which is located in a fourth column line C4, may be set to have a column matrix form of $[1101]^T$.

The second sub-matrix 22a may include column vectors having an even weight. That is, a column vector of the second sub-matrix 22a, which is located in a fifth column line C5, may be set to have a column matrix form of $[1010]^T$, and a column vector of the second sub-matrix 22a, which is located in a sixth column line C6, may be set to have a column matrix form of $[0110]^T$. In addition, a column vector of the second sub-matrix 22a, which is located in a seventh column line C7, may be set to have a column matrix form of $[1001]^T$, and a column vector of the second sub-matrix 22a, which is located in an eighth column line C8, may be set to have a column matrix form of $[0101]^T$.

A row vector of the error check matrix, which is located in a first row line R1, may be set to have a row matrix form of [10111010], and a row vector of the error check matrix, which is located in a second row line R2, may be set to have a row matrix form of [11010101]. In addition, a row vector of the error check matrix, which is located in a third row line R3, may be set to have a row matrix form of [11101100], and a row vector of the error check matrix, which is located in a fourth row line R4, may be set to have a row matrix form of [01110011].

Figure 6:
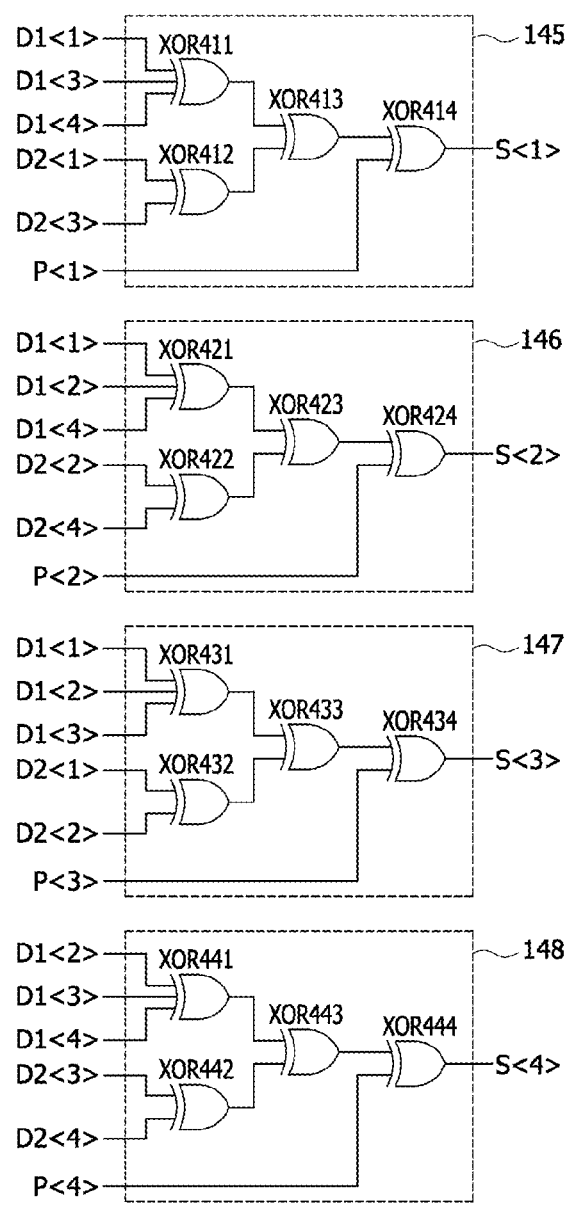
FIG. 6 is a circuit diagram illustrating a representation of an example of a syndrome generation circuit included in the error correction circuit of FIG. 2.

Referring to FIG. 6, the syndrome generation circuit 141 may include a first syndrome generation circuit 145, a second syndrome generation circuit 146, a third syndrome generation circuit 147 and a fourth syndrome generation circuit 148.

The first syndrome generation circuit 145 may include exclusive OR gates XOR411, XOR412, XOR413 and XOR414. In the error check matrix illustrated in FIG. 5, since the row vector located in the first row line R1 is set to have a row matrix form of [10111010], the first bit S<1> of the syndrome signal may be generated by exclusive OR operations of the first bit D1<1> of the first data, the third bit D1<3> of the first data, the fourth bit D1<4> of the first data, the first bit D2<1> of the second data, the third bit D2<3> of the second data and the first bit P<1> of the parity signal.

The second syndrome generation circuit 146 may include exclusive OR gates XOR421, XOR422, XOR423 and XOR424. In the error check matrix illustrated in FIG. 5, since the row vector located in the second row line R2 is set to have a row matrix form of [11010101], the second bit S<2> of the syndrome signal may be generated by exclusive OR operations of the first bit D1<1> of the first data, the second bit D1<2> of the first data, the fourth bit D1<4> of the first data, the second bit D2<2> of the second data, the fourth bit D2<4> of the second data and the second bit P<2> of the parity signal.

The third syndrome generation circuit 147 may include exclusive OR gates XOR431, XOR432, XOR433 and XOR434. In the error check matrix illustrated in FIG. 5, since the row vector located in the third row line R3 is set to have a row matrix form of [11101100], the third bit S<3> of the syndrome signal may be generated by exclusive OR operations of the first bit D1<1> of the first data, the second bit D1<2> of the first data, the third bit D1<3> of the first data, the first bit D2<1> of the second data, the second bit D2<2> of the second data and the third bit P<3> of the parity signal.

The fourth syndrome generation circuit 148 may include exclusive OR gates XOR441, XOR442, XOR443 and XOR444. In the error check matrix illustrated in FIG. 5, since the row vector located in the fourth row line R4 is set to have a row matrix form of [01110011], the fourth bit S<4> of the syndrome signal may be generated by exclusive OR operations of the second bit D1<2> of the first data, the third bit D1<3> of the first data, the fourth bit D1<4> of the first data, the third bit D2<3> of the second data, the fourth bit D2<4> of the second data and the fourth bit P<4> of the parity signal.

The syndrome signal S<1:4> generated by the syndrome generation circuit 141 illustrated in FIG. 6 using the error check matrix of FIG. 5 may include information on errors included in the first and second data D1<1:4> and D2<1:4>. For example, if the syndrome signal S<1:4> is generated to include a column vector $[0111]^T$ having an odd weight, the column vector $[0111]^T$ of the syndrome signal S<1:4> may be consistent with the column vector of the first sub-matrix 21a located in the second column line C2 of the error check matrix. Accordingly, in such a case, the second bit D1<2> of the first data may be regarded as an erroneous bit. If the syndrome signal S<1:4> is generated to include a column vector $[0000]^T$, the first and second data D1<1:4> and D2<1:4> may be regarded as normal data without any erroneous bit.

Referring to FIG. 7, if the syndrome signal S<1:4> is generated to include a column vector $[0000]^T$, no erroneous bit exists in the first and second data D1<1:4> and D2<1:4>. Thus, in such a case, no repair operation is required. If the syndrome signal S<1:4> is generated to have a logic level combination with an odd weight, the first data D1<1:4> may have an erroneous bit. In such a case, a repair operation may be performed to repair the first cell array 111 in which the first data D1<1:4> are stored. If the syndrome signal S<1:4> is generated to have a logic level combination with an even weight, the second data D2<1:4> may have an erroneous bit. In such a case, a repair operation may be performed to repair the second cell array 121 in which the second data D2<1:4> are stored.

As described above, the first data D1<1:4> may be regarded as erroneous data if the syndrome signal S<1:4> is generated to have a logic level combination with an odd weight, and the second data D2<1:4> may be regarded as erroneous data if the syndrome signal S<1:4> is generated to have a logic level combination with an even weight.

Figure 8:
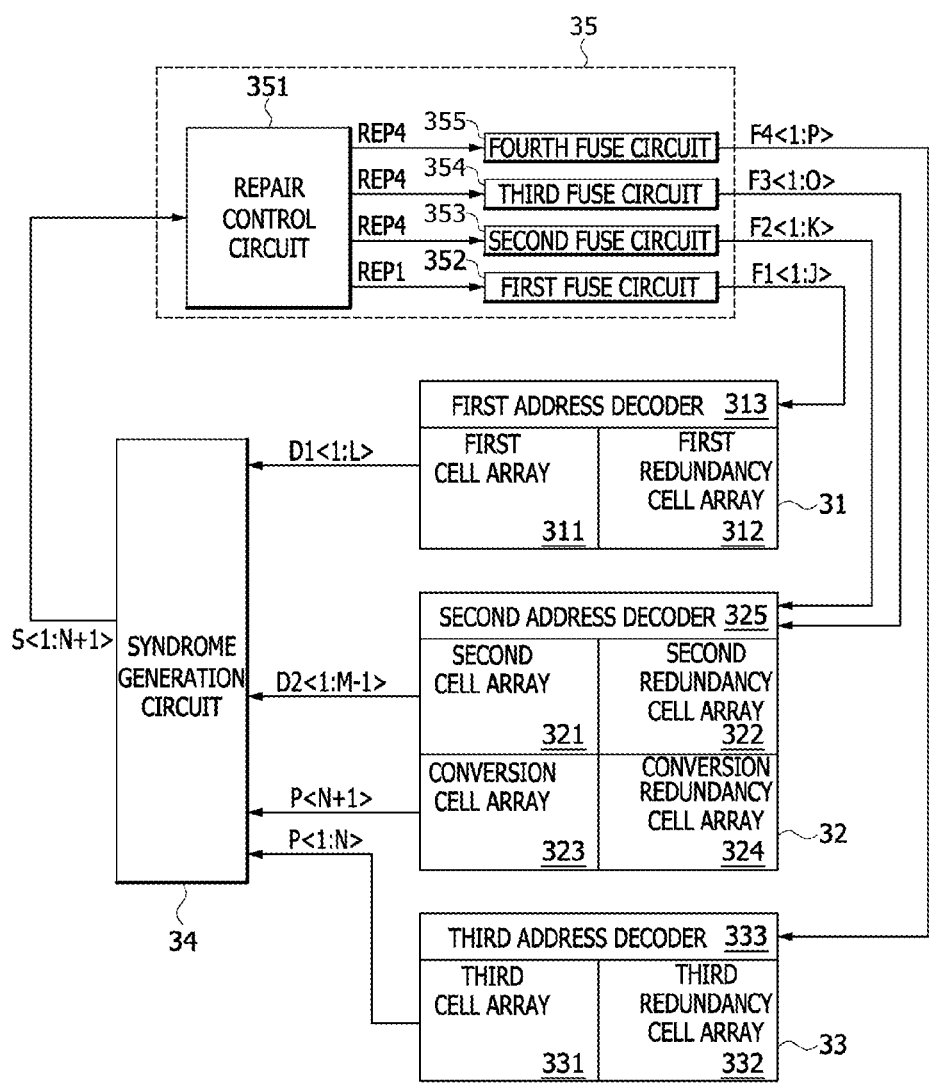
FIG. 8 is a block diagram illustrating a representation of an example of a configuration of a semiconductor device according to an embodiment.

Referring to FIG. 8, a semiconductor device 3 according to an embodiment may include a first data storage circuit 31, a second data storage circuit 32, a parity storage circuit 33, a syndrome generation circuit 34 and a fuse signal generation circuit 35.

The first data storage circuit 31 may include a first cell array 311, a first redundancy cell array 312 and a first address decoder 313. The first cell array 311 may store first data D1<1:L> therein during a write operation. The first data D1<1:L> stored in the first cell array 311 may be outputted from the first cell array 311 during a read operation. The first address decoder 313 may decode an address to store the first data D1<1:L> in the first cell array 311 or to output the first data D1<1:L> from the first cell array 311. The first address decoder 313 may be configured to store the first data D1<1:L> in the first redundancy cell array 312 in response to a first fuse signal F1<1:J> during the write operation if the first cell array 311 has an erroneous cell. The first address decoder 313 may be configured to output the first data D1<1:L> from the first redundancy cell array 312 in response to the first fuse signal F1<1:J> during the read operation if the first cell array 311 has an erroneous cell. The number of bits included in the first data D1<1:L> may be set to be different according to the embodiments.

The second data storage circuit 32 may include a second cell array 321, a second redundancy cell array 322, a conversion cell array 323, a conversion redundancy cell array 324 and a second address decoder 325. The second cell array 321 may store second data D2<1:M−1> therein during the write operation. The second data D2<1:M−1> stored in the second cell array 321 may be outputted from the second cell array 321 during the read operation. The conversion cell array 323 may store an $(N+1)^{th}$ bit P<N+1> of a parity signal therein during the write operation. The $(N+1)^{th}$ parity bit P<N+1> stored in the conversion cell array 323 may be outputted from the conversion cell array 323 during the read operation. The second address decoder 325 may decode an address to store the second data D2<1:M−1> in the second cell array 321 or to output the second data D2<1:M−1> from the second cell array 321. The second address decoder 325 may decode an address to store an $(N+1)^{th}$ bit P<n+1> of the parity signal in the conversion cell array 323 or to output the $(N+1)^{th}$ parity bit P<n+1> from the conversion cell array 323. The second address decoder 325 may be configured to store the second data D2<1:M−1> in the second redundancy cell array 322 in response to a second fuse signal F2<1:K> during the write operation if the second cell array 321 has an erroneous cell. The second address decoder 325 may be configured to output the second data D2<1:M−1> from the second redundancy cell array 322 in response to the second fuse signal F2<1:K> during the read operation if the second cell array 321 has an erroneous cell. The number of bits included in the second data D2<1:M−1> may be set to be different according to the embodiments. The second address decoder 325 may be configured to store the $(N+1)^{th}$ bit P<n+1> of the parity signal in the conversion redundancy cell array 324 in response to a third fuse signal F3<1:O> during the write operation if the conversion cell array 323 has an erroneous cell. The second address decoder 325 may be configured to output the $(N+1)^{th}$ parity bit P<n+1> from the conversion redundancy cell array 324 in response to the third fuse signal F3<1:O> during the read operation if the conversion cell array 323 has an erroneous cell.

The parity storage circuit 33 may include a third cell array 331, a third redundancy cell array 332 and a third address decoder 333. The third cell array 331 may store a parity signal P<1:N> therein during the write operation. The parity signal P<1:N> may be a signal having "N"-number of bits, and the number "N" may be set to be different according to the embodiments. The parity signal P<1:N> stored in the third cell array 331 may be outputted during the read operation. The third address decoder 333 may decode an address to store the parity signal P<1:N> in the third cell array 331 or to output the parity signal P<1:N> from the third cell array 331. The third address decoder 333 may be configured to store the parity signal P<1:N> in the third redundancy cell array 332 in response to a fourth fuse signal F4<1:P> during the write operation if the third cell array 331 has an erroneous cell. The third address decoder 333 may be configured to output the parity signal P<1:N> from the third redundancy cell array 332 in response to the fourth fuse signal F4<1:P> during the read operation if the third cell array 331 has an erroneous cell.

The syndrome generation circuit 34 may receive the first data D1<1:L>, the second data D2<1:M−1> and the parity signal P<1:N+1> (i.e., P<N+1> and P<1:N>) to generate a syndrome signal S<1:N+1> including information on errors of the first data D1<1:L>, the second data D2<1:M−1> and the parity signal P<1:N+1>. The syndrome signal S<1:N+1> may be generated by an error correction code (ECC) scheme using a Hamming code. The Hamming code may be realized by an error check matrix for correcting errors of data. The error check matrix may be realized to include sub-matrices having column vectors, and each of the column vectors may have an odd weight or an even weight.

The fuse signal generation circuit 35 may include a repair control circuit 351, a first fuse circuit 352, a second fuse circuit 353, a third fuse circuit 354 and a fourth fuse circuit 355.

The repair control circuit 351 may generate a first repair signal REP1, a second repair signal REP2, a third repair signal REP3 and a fourth repair signal REP4 in response to the syndrome signal S<1:N+1>. The repair control circuit 351 may generate the first repair signal REP1 which is enabled to repair the first cell array 311 according to a logic level combination of the syndrome signal S<1:N+1> if the first cell array 311 storing the first data D1<1:L> has an erroneous cell. The repair control circuit 351 may generate the second repair signal REP2 which is enabled to repair the second cell array 321 according to a logic level combination of the syndrome signal S<1:N+1> if the second cell array 321 storing the second data D2<1:L> has an erroneous cell. The repair control circuit 351 may generate the third repair signal REP3 which is enabled to repair the conversion cell array 323 according to a logic level combination of the syndrome signal S<1:N+1> if the conversion cell array 323 storing the $(N+1)^{th}$ parity bit P<n+1> has an erroneous cell. The repair control circuit 351 may generate the fourth repair signal REP4 which is enabled to repair the third cell array 331 according to a logic level combination of the syndrome signal S<1:N+1> if the third cell array 331 storing the parity signal P<1:N> has an erroneous cell.

The first fuse circuit 352 may generate the first fuse signal F1<1:J> in response to the first repair signal REP1. The first fuse circuit 352 may generate the first fuse signal F1<1:J> which is set to have a logic level combination for performing a repair operation for replacing the first cell array 311 having an erroneous cell with the first redundancy cell array 312 if the first repair signal REP1 is enabled. The logic level combination of the first fuse signal F1<1:J> for the repair operation may be set to be different according to the embodiments.

The second fuse circuit 353 may generate the second fuse signal F2<1:K> in response to the second repair signal REP2. The second fuse circuit 353 may generate the second fuse signal F2<1:K> which is set to have a logic level combination for performing a repair operation for replacing the second cell array 321 having an erroneous cell with the second redundancy cell array 322 if the second repair signal REP2 is enabled. The logic level combination of the the second fuse signal F2<1:K> for the repair operation may be set to be different according to the embodiments.

The third fuse circuit 354 may generate the third fuse signal F3<1:O> in response to the third repair signal REP3. The third fuse circuit 354 may generate the third fuse signal F3<1:O> which is set to have a logic level combination for performing a repair operation for replacing the conversion cell array 331 having an erroneous cell with the conversion redundancy cell array 332 if the third repair signal REP3 is enabled. The logic level combination of the the third fuse signal F3<1:O> for the repair operation may be set to be different according to the embodiments.

The fourth fuse circuit 355 may generate the fourth fuse signal F4<1:P> in response to the fourth repair signal REP4. The fourth fuse circuit 355 may generate the fourth fuse signal F4<1:P> which is set to have a logic level combination for performing a repair operation for replacing the third cell array 331 having an erroneous cell with the third redundancy cell array 332 if the fourth repair signal REP4 is enabled. The logic level combination of the the fourth fuse signal F4<1:P> for the repair operation may be set to be different according to the embodiments.

According to the semiconductor device illustrated in FIG. 8, the number of bits of the second data D2<1:M−1> is reduced by one bit and the $(N+1)^{th}$ parity bit P<N+1> is used in addition to the parity signal P<1:N>, in contrast to the semiconductor device illustrated in FIG. 1. The $(N+1)^{th}$ parity bit P<N+1> may be stored in the conversion cell array 323 of the second data storage circuit 32 that stores the second data D2<1:M−1>. That is, the cell array storing the $M^{th}$ bit D2<M> of the second data D2<1:M> in the semiconductor device of FIG. 1 may be used as the conversion cell array 323 storing the $(N+1)^{th}$ parity bit P<N+1>. As the $(N+1)^{th}$ parity bit P<N+1> is additionally used, the semiconductor device illustrated in FIG. 8 may detect even a two-bit error included in the first data D1<1:L>, the second data D2<1:M−1> or the parity signal P<1:N+1>.

FIG. 9 illustrates an error check matrix corresponding to a case that the number of the parity bits, for example, is five in the error check matrix used in the semiconductor device of FIG. 8.

Referring to FIG. 9, the error check matrix may include a first sub-matrix 41, a second sub-matrix 42 and a third sub-matrix 43. The first sub-matrix 41 may include column vectors comprised of unit vectors. That is, a column vector of the first sub-matrix 41, which is located in a first column line C1, may be set to have a column matrix form of $[10000]^T$, and a column vector of the first sub-matrix 41, which is located in a second column line C2, may be set to have a column matrix form of $[01000]^T$. In addition, a column vector of the first sub-matrix 41, which is located in a third column line C3, may be set to have a column matrix form of $[00100]^T$, and a column vector of the first sub-matrix 41, which is located in a fourth column line C4, may be set to have a column matrix form of $[00010]^T$. The first sub-matrix 41 may include a conversion sub-matrix 411, and a column vector of the conversion sub-matrix 411, which is located in a fifth column line C5, may be set to have a column matrix form of $[00001]^T$.

Referring to FIG. 9, the second sub-matrix 42 may include column vectors having an odd weight. That is, a column vector of the second sub-matrix 42, which is located in a sixth column line C6, may be set to have a column matrix form of $[11100]^T$, and a column vector of the second sub-matrix 42, which is located in a seventh column line C7, may be set to have a column matrix form of $[01110]^T$. In addition, a column vector of the second sub-matrix 42, which is located in an eighth column line C8, may be set to have a column matrix form of $[10110]^T$, and a column vector of the second sub-matrix 42, which is located in a ninth column line C9, may be set to have a column matrix form of $[11010]^T$.

Referring to FIG. 9, the third sub-matrix 43 may include column vectors having an odd weight. That is, a column vector of the third sub-matrix 43, which is located in a tenth column line C10, may be set to have a column matrix form of $[10101]^T$, and a column vector of the third sub-matrix 43, which is located in an eleventh column line C11, may be set to have a column matrix form of $[01101]^T$. In addition, a column vector of the third sub-matrix 43, which is located in a twelfth column line C12, may be set to have a column matrix form of $[10011]^T$.

Referring to FIG. 10, if the syndrome signal S<1:5> is generated to have a logic level combination of '00000', no erroneous bit exists in the first and second data D1<1:4> and D2<1:4> and the parity signal P<1:N+1>. Thus, in such a case, no repair operation is required. If the syndrome signal S<1:5> is comprised of unit vectors and a fifth bit S<5> of the syndrome signal S<1:5> has a logic "low" level, the parity signal P<1:N> may be regarded as an erroneous signal. In such a case, a repair operation may be performed to repair the third cell array 331 in which the parity signal P<1:N> is stored. If the syndrome signal S<1:5> is comprised of unit vectors and the fifth bit S<5> of the syndrome signal S<1:5> has a logic "high" level, the $(N+1)^{th}$ parity bit P<N+1> may be regarded as an erroneous bit. In such a case, a repair operation may be performed to repair the conversion cell array 323 in which the $(N+1)^{th}$ parity bit P<N+1> is stored. If the syndrome signal S<1:5> is generated to have a logic level combination with an odd weight and the fifth bit S<5> of the syndrome signal S<1:5> has a logic "low" level, the first data D1<1:4> may be regarded as erroneous data. In such a case, a repair operation may be performed to repair the first cell array 311 in which the first data D1<1:4> are stored. If the syndrome signal S<1:5> is generated to have a logic level combination with an odd weight and the fifth bit S<5> of the syndrome signal S<1:5> has a logic "high" level, the second data D2<1:3> may be regarded as erroneous data. In such a case, a repair operation may be performed to repair the second cell array 321 in which the second data D2<1:4> are stored. If the syndrome signal S<1:5> is generated to have a logic level combination with an even weight, the first data D1<1:4> and the second data D2<1:3> may be regarded as having a two bit error. In such a case, a repair operation may be performed to repair the first cell array 311 storing the first data D1<1:4> and the second cell array 321 storing the second data D2<1:4>.

Figure 11:
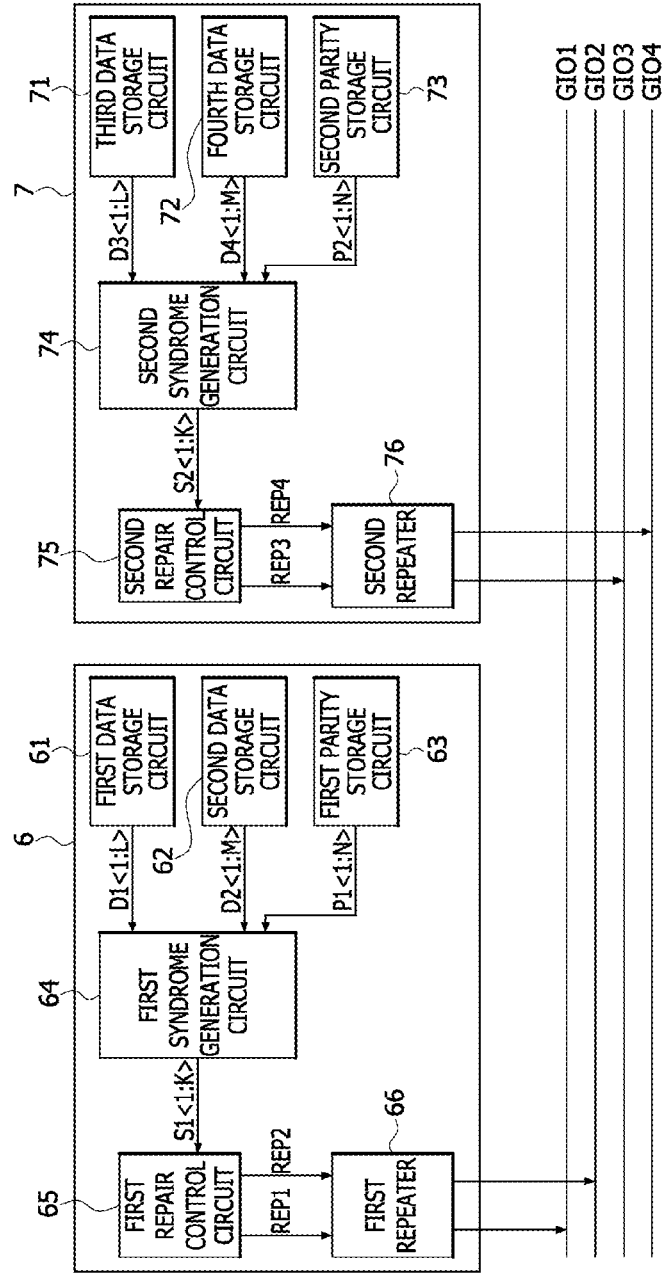
FIG. 11 is a block diagram illustrating a representation of an example of a configuration of a semiconductor device according to an embodiment.

Referring to FIG. 11, a semiconductor device 5 according to an embodiment may include a first semiconductor device 6 and a second semiconductor device 7.

The first semiconductor device 6 may include a first data storage circuit 61, a second data storage circuit 62, a first parity storage circuit 63, a first syndrome generation circuit 64, a first repair control circuit 65 and a first repeater 66. The first data storage circuit 61 may store first data D1<1:L> therein during a write operation and may output the first data D1<1:L> therefrom during a read operation. The second data storage circuit 62 may store second data D2<1:M> therein during the write operation and may output the second data D2<1:M> therefrom during the read operation. The first parity storage circuit 63 may store a first parity signal P1<1:N> therein during the write operation and may output the first parity signal P1<1:N> therefrom during the read operation. The first syndrome generation circuit 64 may generate a first syndrome signal S1<1:K> from the first data D1<1:L>, the second data D2<1:M> and the first parity signal P1<1:N>. The first repair control circuit 65 may generate a first repair signal REP1 and a second repair signal REP2 in response to the first syndrome signal S1<1:K>. The first repair control circuit 65 may generate the first repair signal REP1 which is enabled if the first data D1<1:L> are verified as erroneous data by the first syndrome signal S1<1:K>. The first repair control circuit 65 may generate the second repair signal REP2 which is enabled if the second data D2<1:M> are verified as erroneous data by the first syndrome signal S1<1:K>. The first repeater 66 may amplify the first and second repair signals REP1 and REP2 to transmit the amplified signals through a first I/O line GIO1 and a second I/O line GIO2.

The second semiconductor device 7 may include a third data storage circuit 71, a fourth data storage circuit 72, a second parity storage circuit 73, a second syndrome generation circuit 74, a second repair control circuit 75 and a second repeater 76. The third data storage circuit 71 may store third data D3<1:L> therein during the write operation and may output the third data D3<1:L> therefrom during the read operation. The fourth data storage circuit 72 may store fourth data D4<1:M> therein during the write operation and may output the fourth data D4<1:M> therefrom during the read operation. The second parity storage circuit 73 may store a second parity signal P2<1:N> therein during the write operation and may output the second parity signal P2<1:N> therefrom during the read operation. The second syndrome generation circuit 74 may generate a second syndrome signal S2<1:K> from the third data D3<1:L>, the fourth data D4<1:M> and the second parity signal P2<1:N>. The second repair control circuit 75 may generate a third repair signal REP3 and a fourth repair signal REP4 in response to the second syndrome signal S2<1:K>. The second repair control circuit 75 may generate the third repair signal REP3 which is enabled if the third data D3<1:L> are verified as erroneous data by the second syndrome signal S2<1:K>. The second repair control circuit 75 may generate the fourth repair signal REP4 which is enabled if the fourth data D4<1:M> are verified as erroneous data by the second syndrome signal S2<1:K>. The second repeater 76 may amplify the third and fourth repair signals REP3 and REP4 to transmit the amplified signals through a third I/O line GIO3 and a fourth I/O line GIO4.

Figure 12:
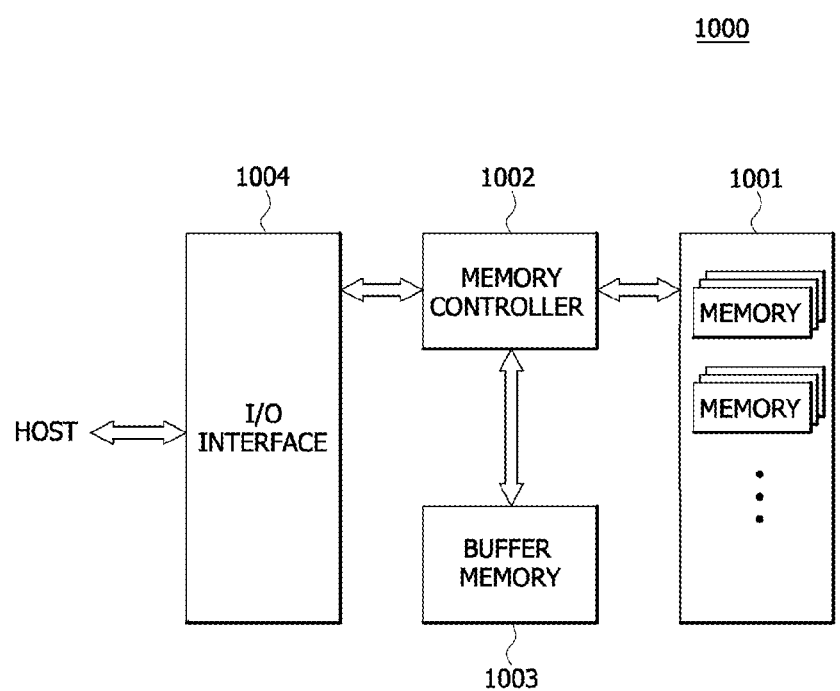
FIGS. 12 and 13 are block diagrams illustrating representations of examples of configurations of semiconductor systems employing the semiconductor device illustrated in FIG. 1.

At least one of the semiconductor devices described with reference to FIGS. 1, 8 and 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor devices illustrated in FIG. 1, 8 or 11. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 13:
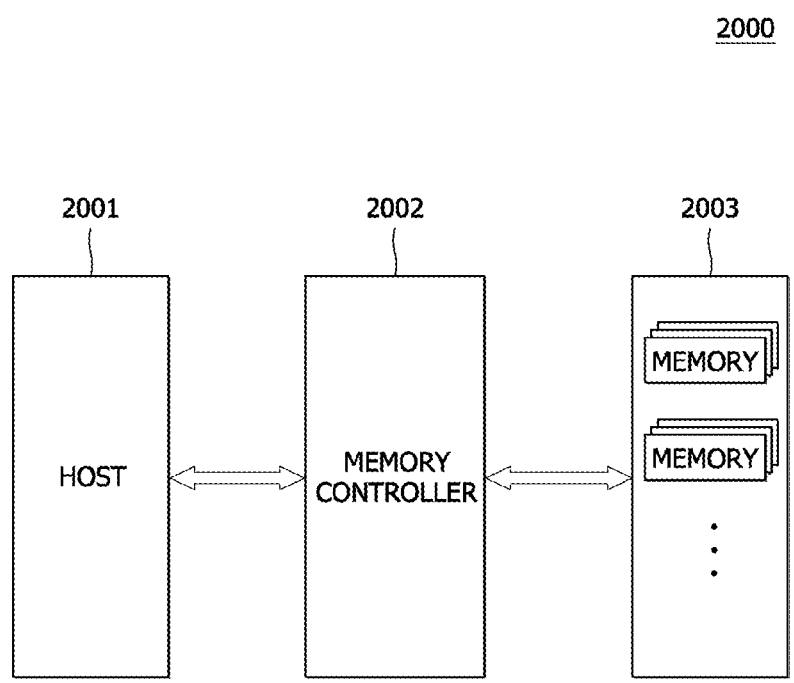

Referring to FIG. 13, an electronic system 2000 according an embodiment may include a host 2001, a memory controller 2002 and a data storage circuit 2003.

The host 2001 may output a request signal and data to the memory controller 2002 to access the data storage circuit 2003. The memory controller 2002 may supply the data, a data strobe signal, a command, addresses and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses and the clock signal to the data storage circuit 2003 in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the addresses and the clock signal from the memory controller 2002 to execute the write operation or the read operation. Each of the memories included in the data storage circuit 2003 may include a circuit that corrects the errors of the data using an error correction code (ECC) scheme. The data storage circuit 2003 may include the semiconductor devices illustrated in FIG. 1, 8 or 11.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a signal chip according to the embodiments. The memory controller 2002 and the data storage circuit 2003 may be realized in a signal chip according to the embodiments.

According to the present disclosure, a semiconductor device may generate a syndrome signal from data using an error correction code (ECC), and the semiconductor device may sense a cell array storing the data including errors to repair the cell array.

In addition, according to the present disclosure, the semiconductor devices may simply perform a repair operation using an operation that generates the syndrome signal with the error correction code (ECC).

What is claimed is:
1. A semiconductor device comprising:
an error correction circuit configured to generate a syndrome signal from first data, second data and a parity signal using an error correction code (ECC) scheme;
a fuse signal generation circuit configured to receive the syndrome signal to generate a first fuse signal for repairing a first cell array storing the first data and a second fuse signal for repairing a second cell array storing the second data;

a first address decoder configured to perform a repair operation that replaces the first cell array with a first redundancy cell array, based on the first fuse signal; and a second address decoder configured to perform a repair operation that replaces the second cell array with a second redundancy cell array, based on the second fuse signal, wherein the ECC scheme uses a Hamming code and the Hamming code is realized by an error check matrix, wherein the error check matrix includes a first sub-matrix and a second sub-matrix, wherein the first sub-matrix is set to include column vectors having an odd weight when the second sub-matrix is set to include column vectors having an even weight, and wherein the first sub-matrix is set to include column vectors having the even weight when the second sub-matrix is set to include column vectors having the odd weight, wherein when a column vector from the column vectors has the odd weight, then the repair operation that replaces the first cell array having an erroneous cell with the first redundancy cell array is performed when there is an error bit in the first data, wherein when a column vector from the column vectors has the even weight, then the repair operation that replaces the second cell array having an erroneous cell with the second redundancy cell array is performed when there is an error bit in the second data, wherein when the syndrome signal has an odd weight the first cell array having the erroneous cell, causing the error bit in the first data, is replaced with the first redundancy cell array, and wherein when the syndrome signal has an even weight the second cell array having the erroneous cell, causing the error bit in the second data, is replaced with the second redundancy cell array.

2. The semiconductor device of claim 1, wherein the number of bits having a value of "1" among the bits included in each of the column vectors of the first sub-matrix is set to be an odd number which is equal to or greater than three.

3. The semiconductor device of claim 1, wherein the fuse signal generation circuit generates the first repair signal which is enabled if a logic level combination of bits included in the syndrome signal corresponds to a column vector included in the first sub-matrix.

4. The semiconductor device of claim 1, wherein the fuse signal generation circuit generates the second repair signal which is enabled if a logic level combination of bits included in the syndrome signal corresponds to a column vector included in the second sub-matrix.

5. The semiconductor device of claim 1, wherein the fuse signal generation circuit includes:

a repair control circuit configured to generate a first repair signal and a second repair signal, one of which is selectively enabled according to a logic level combination of the syndrome signal;

a first fuse circuit configured to generate the first fuse signal based on the first repair signal; and a second fuse circuit configured to generate the second fuse signal based on the second repair signal.

6. The semiconductor device of claim 1, wherein the error correction circuit corrects errors included in the first and second data to generate first corrected data and second corrected data, based on the syndrome signal.

7. A semiconductor device comprising:

a syndrome generation circuit configured to generate a syndrome signal from first data, second data, a parity bit and a parity signal using an error correction code (ECC) scheme;

a repair control circuit configured to generate a first repair control signal for repairing a first cell array storing the first data from the syndrome signal, configured to generate a second repair control signal for repairing a second cell array storing the second data from the syndrome signal, configured to generate a third repair control signal for repairing a conversion cell array storing the parity bit from the syndrome signal, and configured to generate a fourth repair control signal for repairing a third cell array storing the parity signal from the syndrome signal;

a first address decoder configured to perform a repair operation that replaces the first cell array with a first redundancy cell array, based on the first repair control signal; and a second address decoder configured to perform a repair operation that replaces the second cell array with a second redundancy cell array, based on the second repair control signal, wherein the ECC scheme uses a Hamming code and the Hamming code is realized by an error check matrix, wherein the error check matrix includes a first sub-matrix, a second sub-matrix, a third sub-matrix and a conversion sub-matrix, wherein each of the first sub-matrix and the second sub-matrix is set to include column vectors having an odd weight, and wherein the third sub-matrix is set to include column vectors comprised of unit vectors, and wherein when a column vector from the column vectors has the odd weight the first cell array is replaced with the first redundancy cell array when the syndrome signal corresponds to the first data and the second cell array is replaced with the second redundancy cell array when the syndrome signal corresponds to the second data.

8. The semiconductor device of claim 7, wherein if a logic level combination of bits included in the syndrome signal corresponds to a column vector included in the first sub-matrix, the first data are regarded as erroneous data including an erroneous bit; and wherein if a logic level combination of bits included in the syndrome signal corresponds to a column vector included in the second sub-matrix, the second data are regarded as erroneous data including an erroneous bit.

9. The semiconductor device of claim 8, wherein if a logic level combination of bits included in the syndrome signal corresponds to a column vector included in the third sub-matrix, the parity signal is regarded as an erroneous signal including an erroneous bit; and wherein if a logic level combination of bits included in the syndrome signal corresponds to a column vector included in the conversion sub-matrix, the parity bit is regarded as an erroneous bit.

10. The semiconductor device of claim 7, wherein if a logic level combination of bits included in the syndrome signal corresponds to a column vector included in the first sub-matrix, the first repair control signal is enabled;

wherein if a logic level combination of bits included in the syndrome signal corresponds to a column vector included in the second sub-matrix, the second repair control signal is enabled;

wherein if a logic level combination of bits included in the syndrome signal corresponds to a column vector included in the third sub-matrix, the fourth repair control signal is enabled; and wherein if a logic level combination of bits included in the syndrome signal has an even weight, the third repair control signal is enabled.

11. The semiconductor device of claim 7, wherein the second address decoder is configured to perform a repair operation that replaces the conversion cell array with a conversion redundancy cell array based on the third repair control signal.

12. A semiconductor device comprising:
a first semiconductor device configured to generate a first syndrome signal from first data, second data and a first parity signal using an error correction code (ECC) scheme realized by an error check matrix, configured to receive the first syndrome signal to generate a first repair signal for repairing a first cell array storing the first data and to generate a second repair signal for repairing a second cell array storing the second data; and a second semiconductor device configured to generate a second syndrome signal from third data, fourth data and a second parity signal using the error correction code (ECC) scheme, configured to receive the second syndrome signal to generate a third repair signal for repairing a third cell array storing the third data and to generate a fourth repair signal for repairing a fourth cell array storing the fourth data, and configured to transmit the third and fourth repair signals to a third input/output line and a fourth input/output line, wherein the first semiconductor device further comprises a first repeater configured to transmit the first and second repair signals to a first input and output (input/output) line and a second input/output line, wherein when the first syndrome signal has an odd weight the first cell array is replaced with a first redundancy cell array when the first syndrome signal corresponds to the first data and the second cell array is replaced with a second redundancy cell array when the first syndrome signal corresponds to the second data, and wherein when the second syndrome signal has an odd weight the third cell array is replaced with a third redundancy cell array when the second syndrome signal corresponds to the third data and the fourth second cell array is replaced with a fourth redundancy cell array when the second syndrome signal corresponds to the fourth data.

13. The semiconductor device of claim 12,
wherein the ECC scheme uses a Hamming code and the Hamming code is realized by an error check matrix,
wherein the error check matrix includes a first sub-matrix and a second sub-matrix,
wherein the first sub-matrix is set to include column vectors having an odd weight, and
wherein the second sub-matrix is set to include column vectors having an even weight.

14. The semiconductor device of claim 12,
wherein the ECC scheme uses a Hamming code and the Hamming code is realized by an error check matrix,
wherein the error check matrix includes a first sub-matrix and a second sub-matrix, and
wherein if a logic level combination of bits included in the syndrome signal corresponds to a column vector included in the first sub-matrix, the first data are regarded as erroneous data including an erroneous bit.

* * * * *